United States Patent
Tsai et al.

(10) Patent No.: US 11,393,914 B2
(45) Date of Patent: Jul. 19, 2022

(54) GATE SPACER STRUCTURES AND METHODS FOR FORMING THE SAME

(71) Applicant: Taiwan Semiconductor Manufacturing Co., Ltd., Hsinchu (TW)

(72) Inventors: Chun Hsiung Tsai, Hsinchu County (TW); Clement Hsingjen Wann, Carmel, NY (US); Kuo-Feng Yu, Hsinchu County (TW); Ming-Hsi Yeh, Hsinchu (TW); Shahaji B. More, Hsinchu (TW); Yu-Ming Lin, Hsinchu (TW)

(73) Assignee: Taiwan Semiconductor Manufacturing Co., Ltd.

( * ) Notice: Subject to any disclaimer, the term of this patent is extended or adjusted under 35 U.S.C. 154(b) by 21 days.

(21) Appl. No.: 16/690,005

(22) Filed: Nov. 20, 2019

(65) Prior Publication Data
US 2020/0251571 A1     Aug. 6, 2020

Related U.S. Application Data

(60) Provisional application No. 62/799,453, filed on Jan. 31, 2019.

(51) Int. Cl.
*H01L 29/66* (2006.01)
*H01L 29/51* (2006.01)
(Continued)

(52) U.S. Cl.
CPC .... *H01L 29/6656* (2013.01); *H01L 21/28194* (2013.01); *H01L 21/823462* (2013.01); *H01L 21/823468* (2013.01); *H01L 29/518* (2013.01)

(58) Field of Classification Search
None
See application file for complete search history.

(56) References Cited

U.S. PATENT DOCUMENTS

| | | | |
|---|---|---|---|
| 6,287,924 B1 | 9/2001 | Chao et al. | |
| 7,256,113 B1 * | 8/2007 | Hellig | H01L 29/6653 257/E21.438 |

(Continued)

FOREIGN PATENT DOCUMENTS

| | | |
|---|---|---|
| JP | 2000156502 A | 6/2000 |
| JP | 2012049350 A | 3/2012 |

OTHER PUBLICATIONS

Office Action directed to related German Patent Application No. 10 2020 100 100.2, dated Oct. 6, 2021; 9 pages.

*Primary Examiner* — Alexander G Ghyka
(74) *Attorney, Agent, or Firm* — Sterne, Kessler, Goldstein & Fox P.L.L.C.

(57) ABSTRACT

The present disclosure relates to a semiconductor device including a substrate having a top surface and a gate stack. The gate stack includes a gate dielectric layer on the substrate and a gate electrode on the gate dielectric layer. The semiconductor device also includes a multi-spacer structure. The multi-spacer includes a first spacer formed on a sidewall of the gate stack, a second spacer, and a third spacer. The second spacer includes a first portion formed on a sidewall of the first spacer and a second portion formed on the top surface of the substrate. The second portion of the second spacer has a thickness in a first direction that gradually decreases. The third spacer is formed on the second portion of the second spacer and on the top surface of the substrate. The semiconductor device further includes a source/drain region formed in the substrate, and a portion of the third spacer abuts the source/drain region and the second portion of the second spacer.

20 Claims, 11 Drawing Sheets

(51) Int. Cl.
*H01L 21/8234* (2006.01)
*H01L 21/28* (2006.01)

(56) References Cited

U.S. PATENT DOCUMENTS

| | | | |
|---|---|---|---|
| 2015/0115374 A1* | 4/2015 | Yin | H01L 29/7833 257/408 |
| 2016/0163815 A1 | 6/2016 | Hoentschel et al. | |
| 2017/0125586 A1* | 5/2017 | Lee | H01L 29/785 |

* cited by examiner

GATE SPACER STRUCTURES AND METHODS FOR FORMING THE SAME

This application claims the benefit of U.S. Provisional Patent Application No. 62/799,453, titled "Gate Spacer Structures and Methods for Forming the Same," which was filed on Jan. 31, 2019 and is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale in fact, the dimensions of the various features may be arbitrarily increased or reduced for clarity of illustration and discussion.

DETAILED DESCRIPTION

Figure 1:
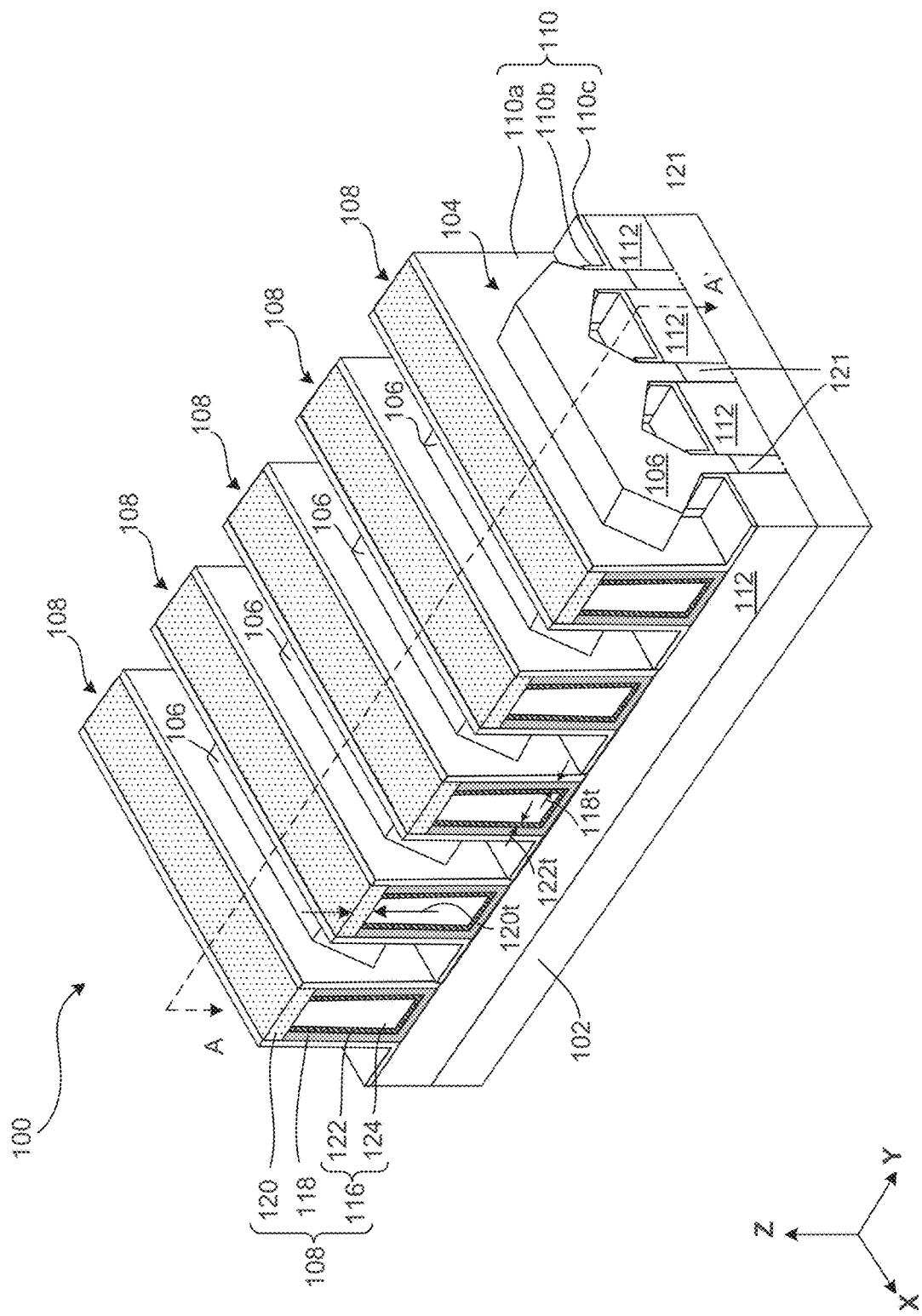
FIG. 1 is an isometric view of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above." "upper." and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of the value (e.g., ±1%, ±2%, ±3%, ±4%, ±5% of the value).

As planar semiconductor devices, such as metal-oxide-semiconductor field effect transistors ("MOSFETs"), are scaled down through various technology nodes, other approaches to increase device density and speed have been advanced. One approach is the fin field effect transistor ("finFET") device which is a three-dimensional FET that includes the formation of a fin-like channel extending from the substrate. FinFETs are compatible with conventional complementary metal-oxide-semiconductor (CMOS) processes and their three-dimensional structure allows them to be aggressively scaled while maintaining gate control and mitigating short channel effects. Gate stacks are used in planar and three-dimensional FETs for controlling the conductivity of the semiconductor device. A gate stack including gate dielectric layer and gate electrode for a finFET device can be formed by a replacement gate process where a polysilicon sacrificial gate structure is replaced by a metal gate structure. Gate dielectric layers, such as a high-k dielectric layer (e.g., a dielectric layer having dielectric constant greater than about 3.9), is formed between the channel and the gate electrode. Spacers can be disposed on sidewalls of the gate stack to protect the gate structures during fabrication processes such as, for example, ion implantation, gate replacement process, epitaxial source/drain structure formation, and other suitable processes. However, these fabrication processes often involve multiple etching and cleaning processes that can etch through portions of the spacer and cause damage to the gate dielectric layer, such as removing portions of the gate dielectric layer. For example, during a silicon germanium (SiGe) loop process, wet chemical etchant, such as diluted hydrofluoric acid, can etch through spacers and remove portions of a gate dielectric layer. The damaged gate dielectric layer not only reduces gate control but voids formed between the gate electrode and channel can also lead to low device yield and even device failure.

To address the above shortcomings, the present disclosure provides a semiconductor device and method of fabricating the same to provide simple and cost-effective structures and process for reducing and/or eliminating damage to dielectric structures, such as gate dielectric layers. Specifically, a multi-spacer structure provides a protective seal to avoid a wet etchant from consuming dielectric structures and penetrating into a gate dielectric, such as a high-k dielectric layer. The multi-spacer structure can thereby prevent gate dielectric layers from damage upon etching and/or cleaning processes, which in turn improves device yield and reduces device failure.

The multi-spacer structures described in the present disclosure can be formed on planar devices (such as planar CMOS devices) or vertical devices (such as finFETs) FIG. 1 is an isometric view of exemplary fin field effect transistors (finFETs) having multi-spacer structures. FIGS. 2-9 provide various exemplary semiconductor structures and fabrication processes that illustrate the formation of multi-spacer structures, in accordance with some embodiments. The fabrication processes provided herein are exemplary, and alternative processes in accordance with this disclosure can be performed (though they are not shown in these figures).

FIG. 1 is an isometric view of a finFET, according to some embodiments FinFET 100 can be included in a microprocessor, memory cell, or other integrated circuit. The view of finFET 100 in FIG. 1 is shown for illustration purposes and may not be drawn to scale FinFET 100 may include further suitable structures, such as additional spacers, liner layers, contact structures, and any other suitable structures, are not illustrated in FIG. 1 for the sake of clarity.

FinFET 100 can be formed on a substrate 102 and can include a fin structure 104 having fin regions 121 and S/D regions 106, gate structures 108 disposed on fin structures 104, spacers 110 disposed on opposite sides of each of gate structures 108, and shallow trench isolation (STI) regions 112. FIG. 1 shows five gate structures 108. However, based on the disclosure herein, finFET 100 can have more or fewer gate structures. In addition, finFET 100 can be incorporated into an integrated circuit through the use of other structural components—such as S/D contact structures, gate contact structures, conductive vias, conductive lines, dielectric layers, and passivation layers—that are omitted for the sake of clarity.

Substrate 102 can be a semiconductor material such as, but not limited to, silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide, or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

Fin structure 104 represents current-carrying structures of finFET 100 and can traverse along a Y-axis and through gate structures 108. Fin structure 104 can include: (i) portions of fin regions 121 underlying gate structures 108, and (ii) S/D regions 106 disposed on portions of fin regions 121 that are formed on opposing sides of each of gate structures 108. Portions of fin regions 121 of fin structure 104 under gate structures 108 (not shown in FIG. 1) can extend above STI regions 112 and can be wrapped around by corresponding one of gate structures 108. Fin regions 121 on opposing sides of gate structures 108 can be etched back such that S/D regions 106 can be epitaxially grown on the etched back portions of fin regions 121.

Fin regions 121 of fin structure 104 can include material similar to substrate 102. S/D regions 106 can include an epitaxially-grown semiconductor material. In some embodiments, the epitaxially-grown semiconductor material is the same material as substrate 102. In some embodiments, the epitaxially-grown semiconductor material includes a different material from substrate 102. The epitaxially-grown semiconductor material can include: (i) a semiconductor material such as, for example, germanium or silicon; (ii) a compound semiconductor material such as, for example, gallium arsenide and/or aluminum gallium arsenide; or (iii) a semiconductor alloy such as, for example, silicon germanium and/or gallium arsenide phosphide. Other materials for fin structure 104 are within the scope of this disclosure.

In some embodiments, S/D regions 106 can be grown by (i) chemical vapor deposition (CVD) such as, for example, by low pressure CVD (LPCVD), ultrahigh vacuum CVD (UHVCVD), reduced pressure CVD (RPCVD), or a suitable CVD process; (ii) molecular beam epitaxy (MBE) processes, (iii) a suitable epitaxial process; and/or (iv) combinations thereof. In some embodiments, S/D regions 106 can be grown by an epitaxial deposition/partial etch process, which repeats the epitaxial deposition/partial etch process at least once. Such repeated deposition/partial etch process is also called a "cyclic deposition-etch (CDE) process." In some embodiments, S/D regions 106 can be grown by selective epitaxial growth (SEG), where an etching gas is added to promote the selective growth of semiconductor material on the exposed surfaces of fin structures, but not on insulating material (e.g., dielectric material of STI regions 112). Other methods for epitaxially growing S/D regions 106 are within the scope of this disclosure.

S/D regions 106 can be p-type regions or n-type regions in some embodiments, p-type S/D regions 106 can include SiGe and can be in-situ doped during an epitaxial growth process using p-type dopants such as, for example, boron, indium, or gallium. For p-type in-situ doping, p-type doping precursors such as, but not limited to, diborane ($B_2H_6$), boron trifluoride ($BF_3$), and/or other p-type doping precursors can be used. In some embodiments, n-type S/D regions 106 can include Si and can be in-situ doped during an epitaxial growth process using n-type dopants such as, for example, phosphorus or arsenic. For n-type in-situ doping, n-type doping precursors such as, but not limited to, phosphine ($PH_3$), arsine ($AsH_3$), and/or other n-type doping precursor can be used in some embodiments, S/D regions 106 are not in-situ doped, and an ion implantation process is performed to dope S/D regions 106.

Spacer 110 can include spacer portions 100a that form sidewalls of gate structure 108 and are in contact with dielectric layer 118, spacer portions 110b that form sidewalls of fin structure 104, and spacer portions 110c that form protective layers on STI regions 106. Spacers 110 can also be a multi-spacer structure including more than one spacer. According to the present disclosure, spacers 110 can include a first spacer formed on sidewalls of gate structure 108, such as spacer portions 110a. Spacers 110 can also include a second spacer formed on the first spacer and on STI region 106. The second spacer can include an upper portion extending in the vertical direction (e.g., z direction) and a lower portion extending in the horizontal direction (e.g., y direction). The lower portion of the second spacer can be a wedge-shaped structure that extends on the top surface of STI region 106. Spacers 110 can also include a third spacer on the second spacer and also on the top surface of STI region 106. The etch selectivity between the second and third spacers can be greater than about 10, in which the second spacer can be used as a protective seal to avoid wet etchants from consuming dielectric structures and penetrating into a gate dielectric, such as preventing dielectric layer 118 from being damaged during cleaning and etching processes. The first, second, and third spacers can be collectively referred to as spacers 110 and are not individually depicted in FIG. 1 for simplicity. Spacers 110 can include insulating material such as, for example, silicon oxide, silicon nitride, a low-k material, or a combination thereof. Spacers 110 can have a low-k material with a dielectric constant less than 3.9 (e.g., less than 3.5, 3, or 2.8). Spacer 110 can be a multi-spacer structure that includes one or more spacers. For example, spacer 110 can include a first spacer formed on the sidewalls of gate structures 108 and a second spacer formed on sidewalls the sidewalls of the first spacer and also on STI regions 106. Spacer 110 can include additional spacers, according to some embodiments. For example, spacer 110 can include first, second, and third spacers as described below in FIGS. 2-9. Spacers 110 can be formed using suitable deposition processes such as, for example, atomic layer deposition (ALD). In some embodiments, spacers 110 can be deposited using CVD, LPCVD, UHVCVD, RPCVD, physical vapor deposition (PVD), any suitable deposition processes, and/or combinations thereof. Other materials and thicknesses for spacers 110 are within the scope of this disclosure.

Each gate structure 108 can include a gate electrode 116, a dielectric layer 118 adjacent to and in contact with gate electrode 116, and a gate capping layer 120. Gate structures 108 can be formed by a gate replacement process.

In some embodiments, dielectric layer 118 can be formed using a high-k dielectric material (e.g., dielectric material having dielectric constant greater than about 3.9). Dielectric layer 118 can be formed by CVD, atomic layer deposition (ALD), physical vapor deposition (PVD), e-beam evaporation, or other suitable processes. In some embodiments, dielectric layer 118 can include (i) a layer of silicon oxide, silicon nitride, and/or silicon oxynitride, (ii) a high-k dielectric material such as, for example, hafnium oxide ($HfO_2$), $TiO_2$, HfZrO, $Ta_2O_3$, $HfSiO_4$, $ZrO_2$, $ZrSiO_2$, (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, dielectric layer 118 can include a single layer or a stack of insulating material layers. Other materials and formation methods for dielectric layer 118 are within the scope of this disclosure. For example, portions of dielectric layer 118 are formed on horizontal surfaces, such as top surface of STI regions 112. Although not visible in FIG. 1, dielectric layer 118 can also be formed on top and sidewalls of fin regions 121 that are under gate electrode 116. In some embodiments, dielectric layer 118 is also formed between sidewalls of gate electrode 116 and spacer portions 110a, as shown in FIG. 1. In some embodiments, dielectric layer 118 have a thickness 118t in a range of about 1 nm to about 5 nm.

Gate electrode 116 can include a gate work function metal layer 122 and a gate metal fill layer 124. In some embodiments, gate work function metal layer 122 is disposed on dielectric layer 118. Gate work function metal layer 122 can include a single metal layer or a stack of metal layers. The stack of metal layers can include metals having work functions similar to or different from each other. In some embodiments, gate work function metal layer 122 can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. Gate work function metal layer 122 can be formed using a suitable process, such as ALD, CVD, PVD, plating, or combinations thereof. In some embodiments, gate work function metal layer 122 has a thickness 122t in a range from about 2 nm to about 15 nm. Other materials, formation methods, and thicknesses for gate work function metal layer 122 are within the scope of this disclosure.

Gate metal fill layer 124 can include a single metal layer or a stack of metal layers. The stack of metal layers can include metals different from each other. In some embodiments, gate metal fill layer 124 can include a suitable conductive material such as, for example, Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate metal fill layer 124 can be formed by ALD, PVD, CVD, or other suitable deposition process. Other materials and formation methods for gate metal fill layer 124 are within the scope of this disclosure.

In some embodiments, gate capping layer 120 can have a thickness 120t in a range from about 5 nm to about 50 nm and can be configured to protect gate structure 108 during subsequent processing of finFET 100. Gate capping layer 120 can include nitride material such as, for example, silicon nitride, silicon-rich nitride, and/or silicon oxynitride. Other materials for gate capping layer 120 are within the scope of this disclosure.

STI regions 112 can provide electrical isolation to finFET 100 from neighboring active and passive elements (not illustrated herein) integrated with or deposited onto substrate 102. STI regions 112 can have a dielectric material such as, for example, silicon oxide, silicon nitride, silicon oxynitride, fluorine-doped silicate glass (FSG), a low-k dielectric material, and/or other suitable insulating material. In some embodiments, STI regions 112 can include a multi-layered structure. The cross-sectional shapes of fin structure 104, S/D regions 106, gate structures 108, spacers 110, and STI regions 112 are illustrative and are not intended to be limiting.

FIGS. 2-8 provide various exemplary semiconductor structures and fabrication processes that illustrate the formation of multi-spacer structures, in accordance with some embodiments. The multi-spacer structures can provide the benefit of reducing and/or eliminating damage to dielectric structures, such as high-k gate dielectric layers. The fabrication processes can be used to form planar semiconductor devices or vertical semiconductor devices, such as finFETs. In some embodiments, the fabrication processes illustrated in FIGS. 2-8 can be used to form semiconductor structures similar to finFET structures described above in FIG. 1. For example, the semiconductor structure illustrated in FIGS. 7-8 can be similar to finFET 100 as viewed from the cut A-A' illustrated in FIG. 1.

Figure 2:
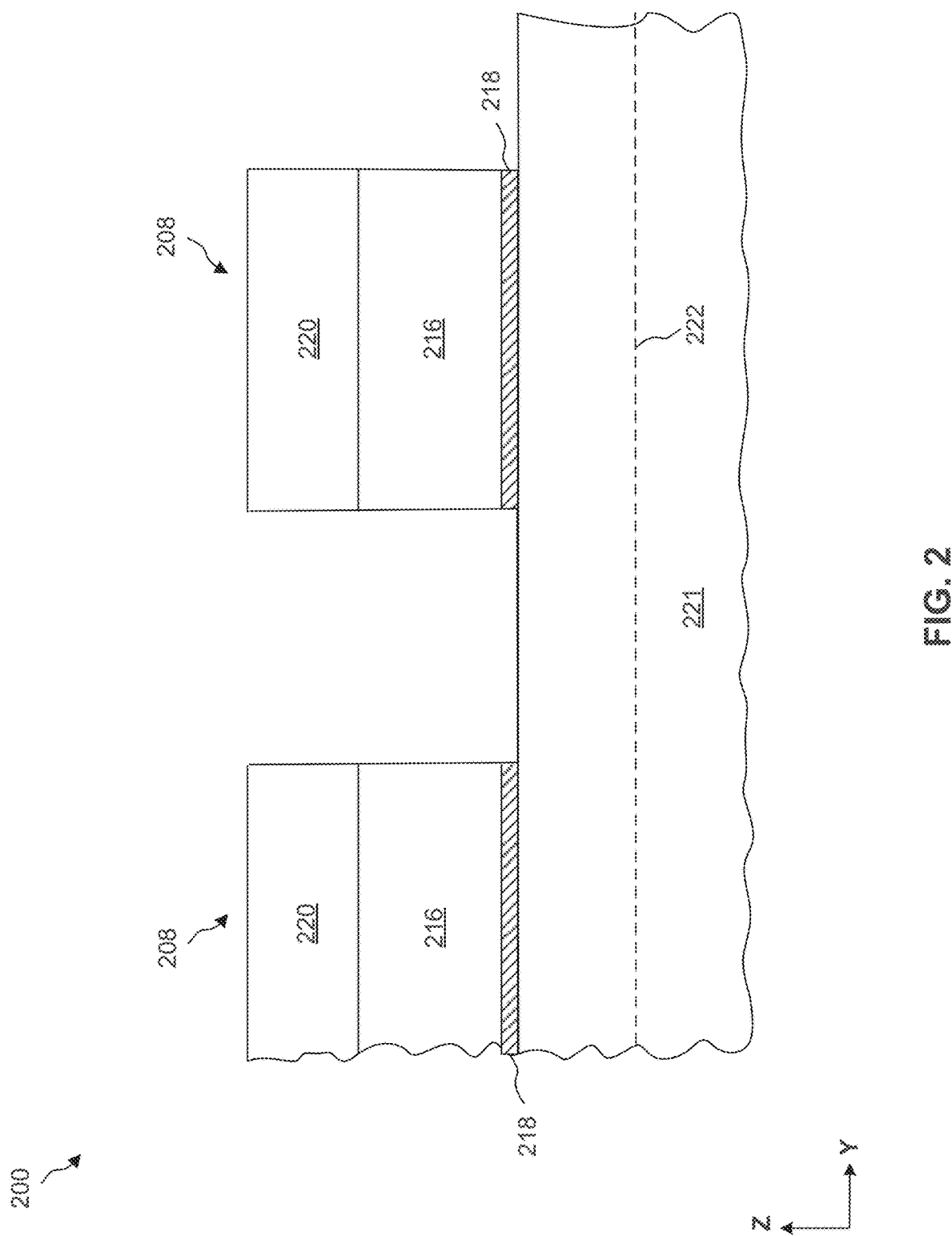
FIGS. 2-9 are cross-sectional views of various partially-formed semiconductor structures, in accordance with some embodiments.

FIG. 2 is a cross-sectional view of a semiconductor structure 200 having two neighboring gate structures 208 formed over a substrate, according to some embodiments. The substrate can include fin region 221. Each gate structure 208 includes a gate dielectric layer 218, a gate electrode 216, and a hard mask 220. Hard mask 220 is shown disposed over gate electrodes 216 and gate dielectric layer 218. In some embodiments, hard mask 220 is used to define the patterning of gate electrodes 216. Channel regions can be formed under gate structures 208.

Fin region 221 can be current-carrying semiconductor structures formed on the substrate. For example, fin region 221 can be similar to fin region 121 described above in FIG. 1. In some embodiments, fin region 221 can include semiconductor material such as, for example, germanium, silicon, silicon carbide, gallium arsenide, gallium phosphide, indium phosphide, indium arsenide, indium antimonide, silicon germanium carbide, silicon germanium, gallium arsenic phosphide, gallium indium phosphide, gallium indium arsenide, gallium indium arsenic phosphide, aluminum indium arsenide, aluminum gallium arsenide, any suitable material, and/or combinations thereof. In some embodiments, fin region 221 can be doped with p-type or n-type dopants.

Gate dielectric layer 218 can be formed on fin region 221 and formed using a high-k dielectric material. Gate dielectric layer 218 can deposited by CVD, ALD, PVD, e-beam evaporation, or other suitable processes. In some embodiments, gate dielectric layer 218 can include a high-k dielectric material such as, for example, $HfO_2$. In some embodiments, gate dielectric layer 218 can include $TiO_2$, HfZrO, $Ta_2O_3$, $HfSiO_4$, $ZrO_2$, $ZrSiO_2$. In some embodiments, gate dielectric layer 218 can be similar to dielectric layer 118 described above in FIG. 1.

Gate electrode 216 can be formed on gate dielectric layer 218 and can include a single metal layer or a stack of metal layers. Gate structures 208 can further include work function layers formed on gate electrode 216 and are not illustrated in FIG. 2 for simplicity. The stack of metal layers can include metals having work functions similar to or different from each other. In some embodiments, gate electrode 216 can be formed of conductive material such as, for example, Al, Cu, W, Ti, Ta, TiN, TaN, NiSi, CoSi, Ag, TaC, TaSiN, TaCN, TiAl, TiAlN, WN, metal alloys, and/or combinations thereof. Gate electrode 216 can be formed using a suitable deposition process, such as ALD, CVD, PVD, plating, and/or combinations thereof. Other materials and formation methods for gate electrode 216 are within the scope of this disclosure. In some embodiments, gate electrode 216 can be formed using a gate replacement process, where a polysilicon gate is removed and a metal gate electrode is formed in the place of the removed polysilicon gate.

Hard mask 220 is formed on gate electrode 216 to protect gate structure 208 during subsequent processing. In some embodiments, hard mask 220 can be formed using a similar material as gate capping layer 120 described above in FIG. 1. For example, hard mask 220 can be formed of any suitable capping material such as, for example, silicon nitride, SiON, SiC, SiOC, SOG, a low-k film, TEOS, PE-oxide, HARP formed oxide, and/or combinations thereof.

Similar to the finFET 100 described in FIG. 1, semiconductor structure 200 can be formed on a substrate where fin regions 221 protrude from STI regions. The STI regions are not visible from the cross-sectional view of semiconductor structure 200 illustrated in FIG. 2, but a top surface of the STI regions is represented by dashed line 222 for ease of description.

Figure 3:
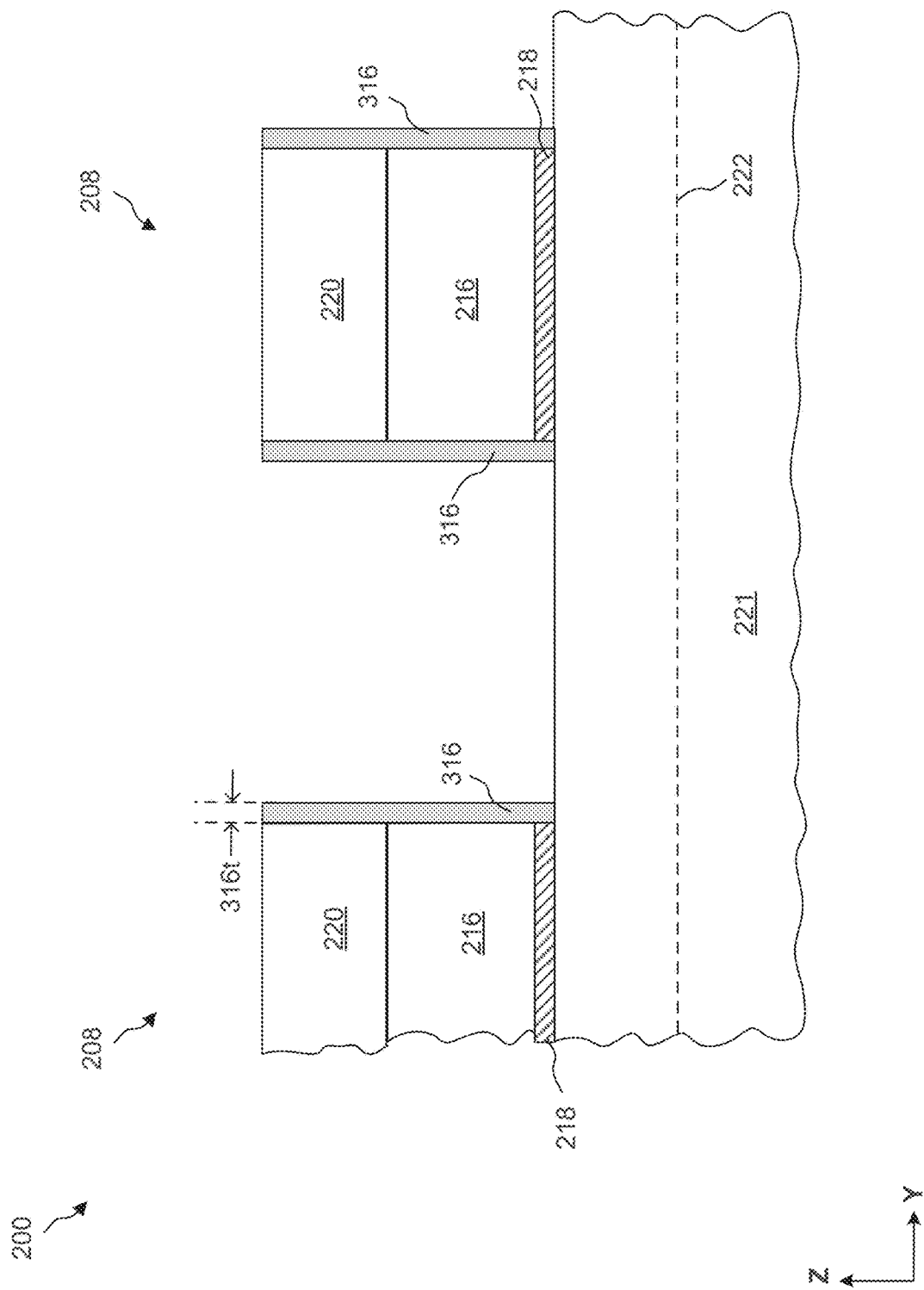

FIG. 3 is a cross-sectional view illustrating first spacers formed on gate structures, according to some embodiments. First spacers 316 can be used to prevent dopants from being implanted into gate structure 208 during an ion implantation process, such as ion implantation processes used to form lightly-doped drain (LDD) region in fin regions 221. As such, first spacers 316 can also be referred to as "seal spacers." As shown in FIG. 3, first spacers 316 cover sidewalls of gate structures 208 and can be formed using an etch-back technique where a blanket deposition of material is anisotropically etched, leaving the material along sidewalls of gate structures 208. In some embodiments, the deposition process can be an ALD process. In some embodiments, the deposition process can be a substantially conformal CVD process. An anisotropic etching process can be subsequently used to preferably remove horizontal portions of the deposited material such that portions of the deposited material remain on the sidewalls of gate structures 208. In some embodiments, first spacers 316 can be made of silicon nitride. In some embodiments, first spacers 316 can be made of a suitable dielectric material, such as silicon oxide, SiON, any suitable dielectric material, and/or combinations thereof. Other applicable deposition processes may also be used. In some embodiments, the thickness $316t$ of first spacer 316 measured along a horizontal direction (e.g., y-direction) can be in a range from about 3 nm to about 9 nm. For example, thickness $316t$ can be between about 3 nm and about 5 nm, between about 5 nm and about 7 nm, or between about 7 nm and about 9 nm. In some embodiments, thickness $316t$ can be about 4 nm. A greater thickness $316t$ can provide greater protection for structures covered by first spacers 316.

Figure 4:
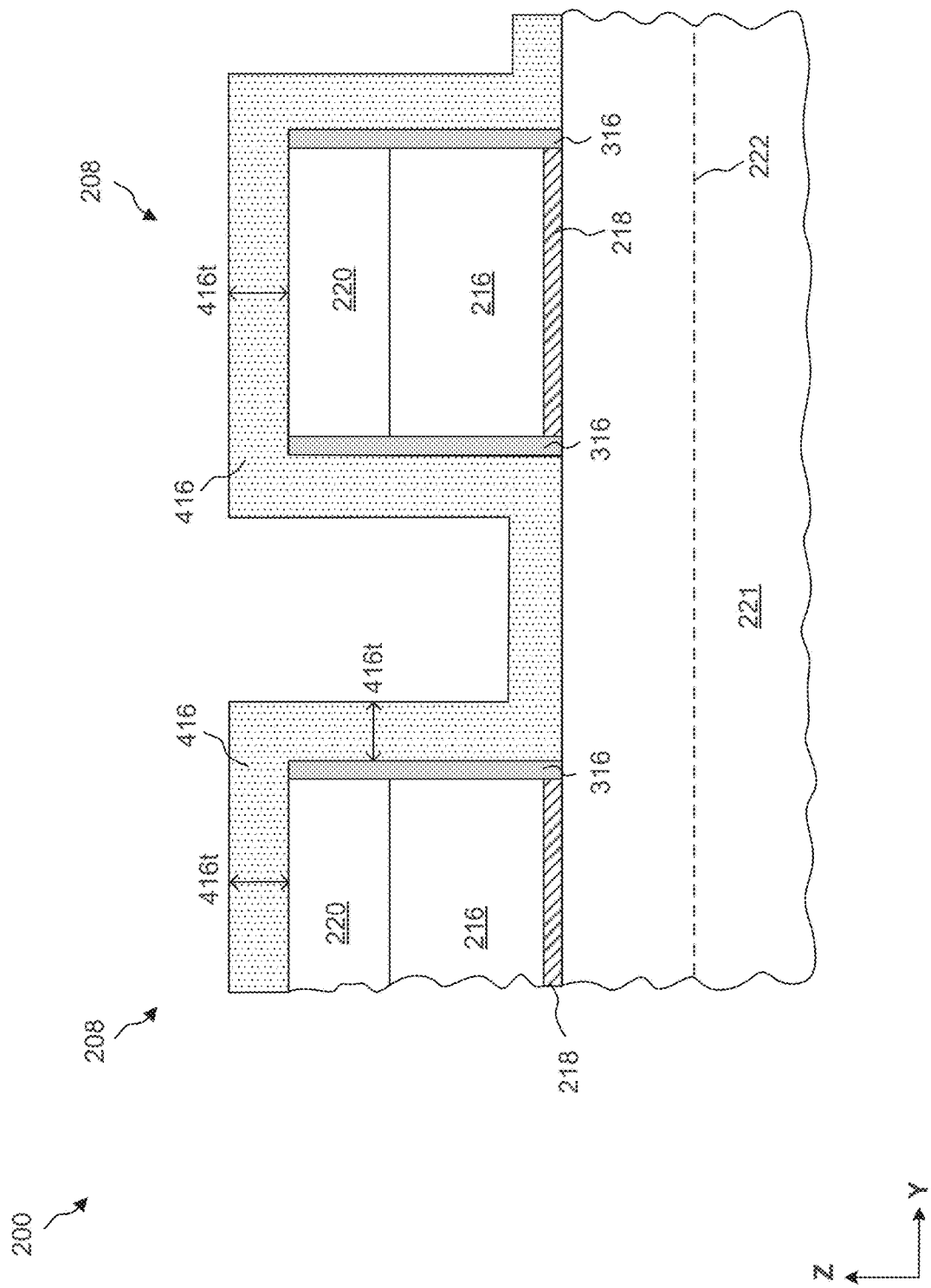

FIG. 4 is a cross-sectional view illustrating a second spacer material formed on the semiconductor structure, according to some embodiments. Second spacer material 416 is blanket deposited over semiconductor structure 200. For example, second spacer material 416 is formed over a top surface of gate structure 208, top and sidewall surfaces of first spacers 316, and the top surface of fin region 221. In some embodiments, second spacer material 416 can be substantially conformally deposited on the horizontal and vertical surfaces (e.g., surfaces in the y-direction and z-direction, respectively). For example, deposited second spacer material 416 has a thickness $416t$ on top surface of gate structure 208 and a sidewall surface of first spacers 316. In some embodiments, thickness $416t$ can be between about 2 nm and about 4 nm. For example, thickness $416t$ can be between about 3 nm and about 5 nm, between about 5 nm and about 7 nm, or between about 7 nm and about 9 nm. In some embodiments, thickness $416t$ can be about 4 nm. A greater thickness $416t$ can provide greater protection for structures covered by the subsequently formed second spacer. In some embodiments, subsequent etching process can reduce thicknesses of second spacer material 416. Therefore, initial value of thickness $416t$ can also be determined by the amount of second spacer material 416 to be removed. In some embodiments, second spacer material 416 can made of a dielectric material that is different from first spacers 316. For example, second spacer material 416 can be silicon oxide and first spacers 316 can be formed of silicon nitride. In some embodiments, second spacer material 416 can be deposited using a substantially conformal deposition process, such as ALD which can deposit a few nanometers of material uniformly in openings of high aspect ratio (e.g., greater than about 10). In some embodiments, second spacer material 416 can be deposited using any suitable deposition process.

Figure 5:
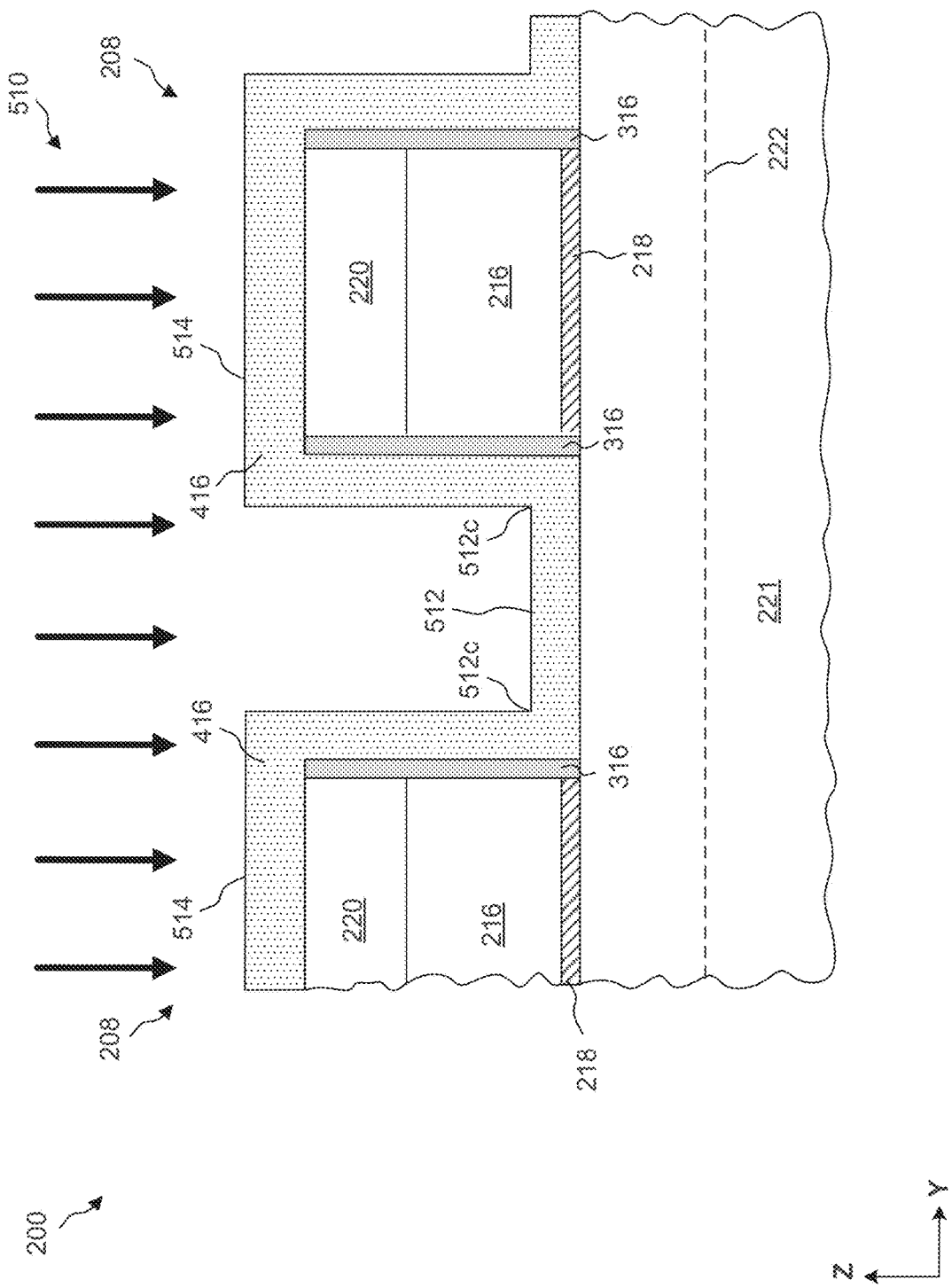

FIG. 5 illustrates an etching process 510 performed on semiconductor structure 200 (from FIG. 4), according to some embodiments. Etching process 510 can be a single etching process or multiple etching processes to remove portions of second spacer material 416. In some embodiments, the etching process 510 can be an anisotropic (e.g., directional) etching process that has a greater etching rate in a vertical direction (e.g., z-direction) than the etching rate in a horizontal direction (e.g., y-direction). In some embodiments, the etching process has a greater etch selectivity of second spacer material 416 over first spacers 316. For example, the etch selectivity can be greater than about 30. In some embodiments, a greater etch selectivity can be used. For example, the etch selectivity can be about 50. In some embodiments, the etch selectivity can be about 100. In some embodiments, etching rate of second spacer material 416 at top surface 512 that is above fin region 221 can be less than the etching rate at top surface 514 that is above hard mask 220. In some embodiments, the etching rate of second spacer at top surface 514 can also vary. For example, etching rate of second spacer at the corner surfaces 512c of second spacer material 416 can be less compared to the etching rate at or near the central region of top surface 512 between the adjacent corner surfaces 512c. The variation in etching rates may be due to greater concentration of etchant ions for etching second spacer material at top surface 514 than for etching at top surface 512 due to differences in structural density that lead to different accessibility of etchant ions. In some embodiments, the etching process can be a plasma etching process. In some embodiments, the etching process can be a biased etching process performed under a pressure of about 3 mTorr to about 25 mTorr. For example, the pressure can be between about 3 mTorr and about 15 mTorr. In some embodiments, the pressure can be between about 15 mTorr and about 25 mTorr. The chemical etchant flow rate of the etching process can be about 5 sccm to about 40 sccm. For example, the chemical etchant flow rate can be between about 5 sccm and about 20 sccm. In some embodiments, the chemical etchant flow rate can be between about 20 sccm and about 40 sccm. In some embodiments, the etching process can be performed under a power of the etching process can be about 50 W to about 200 W, a bias voltage of about 30 V to about 200 V, at a temperature of about 25° C. to about 200° C. For example, the power can be between about 50 W and about 100 W, between about 100 W and about 200 W, and other suitable powers. In some embodiments, the bias voltage can be between about 30 V and about 120 V, between about 120 V and about 200 V, or at other suitable bias voltages. In some embodiments, the temperature can be between about 25° C. and about 100° C., between about 100° C. and about 150° C., between about 150° C. and about 200° C. or at other suitable temperatures. In some embodiments, a chemical etchant gas, such as carbon tetrafluoride ($CF_4$), sulfur tetrafluoride ($SF_4$), and/or nitrogen trifluoride ($NF_3$), can be mixed with hydrogen ($H_2$). In some embodiments, the mixing ratio of hydrogen to the chemical etchant gas can be between about 0 and about 0.5. For example, the mixing ratio can be between about 0 and about 0.2, between about 0.2 and about 0.4, or between about 0.4 and about 0.5. In some embodiments, increasing the bias voltage can increase the etching rate in the vertical direction (e.g., z-direction) while reducing the bias voltage can increase the etching rate in the horizontal direction (e.g., y-direction).

Figure 6:
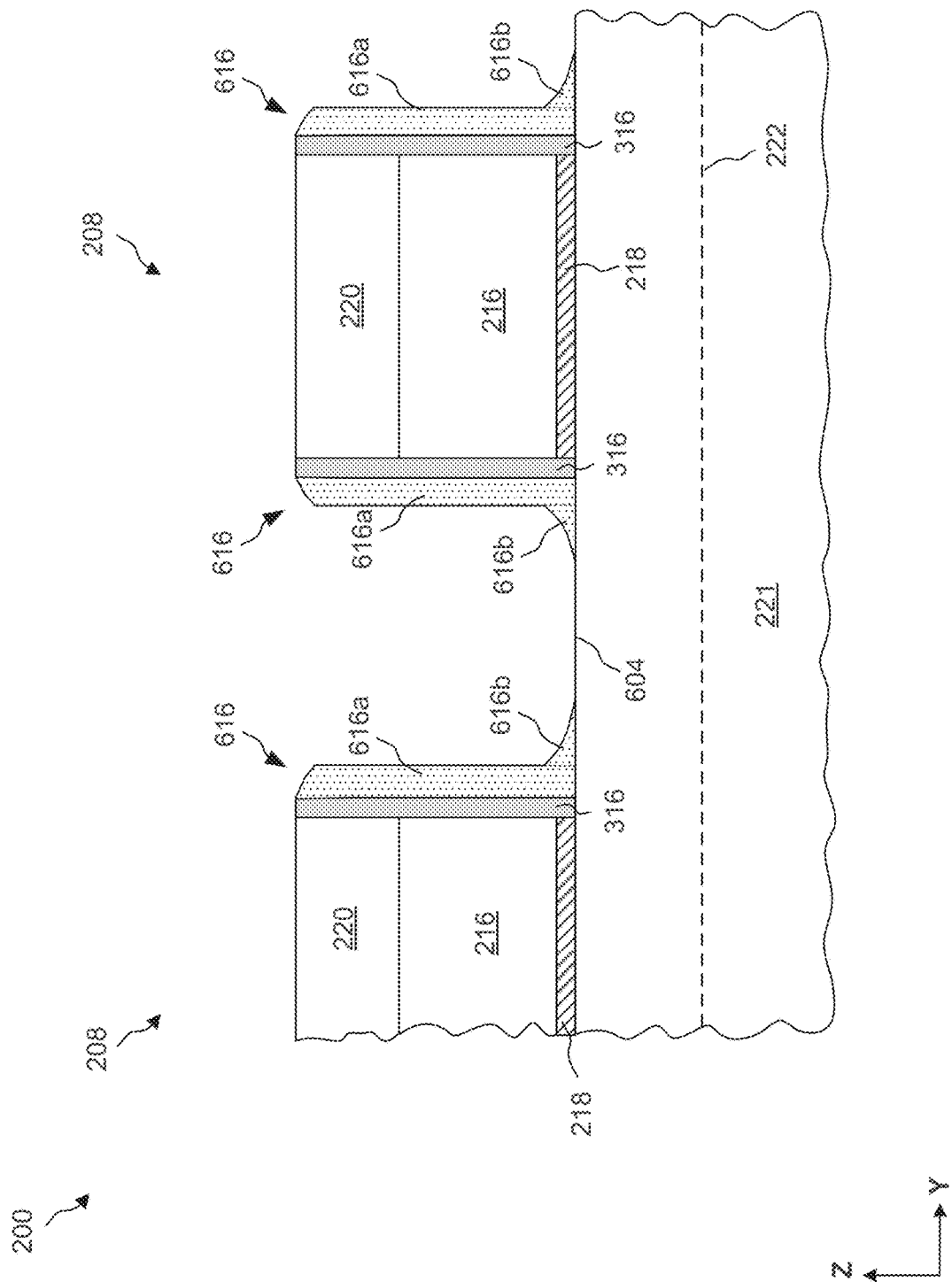

FIG. 6 illustrates a second spacer formed on semiconductor structure 200, according to some embodiments. In some embodiments, second spacer 616 is formed after performing the etching process on semiconductor structure 200 described with respect to FIG. 5 above. The variation in etching rates of second spacer material 416 at bottom corners can form second spacer 616 having an upper portion 616a extending in the vertical direction (e.g., z-direction) and formed on first spacer 316 and a lower portion 616b extending in a horizontal direction (y-direction) and formed on top surface 604 of fin region 221. The upper portion 616a of second spacer 616 can have a substantially conformal thickness along first spacer 316. The lower portion 616b of the second spacer 616 can be in the shape of a "wedge" or "foot" that extends along top surface 604. Specifically, the wedge-shaped lower portion 616b can be a structure that has a gradually-reducing vertical (e.g., in the z-direction) thickness as it extends away from gate structure 208 along the horizontal direction (e.g., y-direction). In some embodiments, first spacer 316 is covered and protected by second spacer 616. For example, second spacer 616 is formed on sidewalls of first spacer 316. In some embodiments, second spacer 616 is formed on top surfaces of first spacer 316 and top surfaces of hard mask 220, thus second spacer 616 fully covers and protects underlying first spacer 316. The wedge-shaped lower portion 616b of second spacer 616 provides additional protection of the lower portions of first spacer 316 against subsequent processing, such as wet chemical etching and cleaning processes, which in turn protects gate dielectric layer 218 that is formed under gate electrode 216 and between adjacent first spacers 316. For example, cleaning processes can be a residue removal cleaning processes using piranha (e.g., a mixture of $H_2SO_4$ and $H_2O_2$ in a 1:4 ratio), which is also referred to as "Caros acid cleaning." In some embodiments, ion implantation processes are used in the fabrication process to form various doped wells and/or regions in fin regions 221 for suitable semiconductor devices. The ion implantation processes can also break chemical bonds and cause defects in first spacer 316 and gate dielectric layer 218 that can result in increased etching rate under acids. In some embodiments, to further protect underlying gate dielectric layer 218, first spacer 316 can also have a similar shape as second spacer 616. For example, first spacer 316 can also have a lower portion extending along top surfaces of fin region 221. The lower portion of first spacer 316 can be similar to lower portion 616b of second spacer 616.

Figure 7:
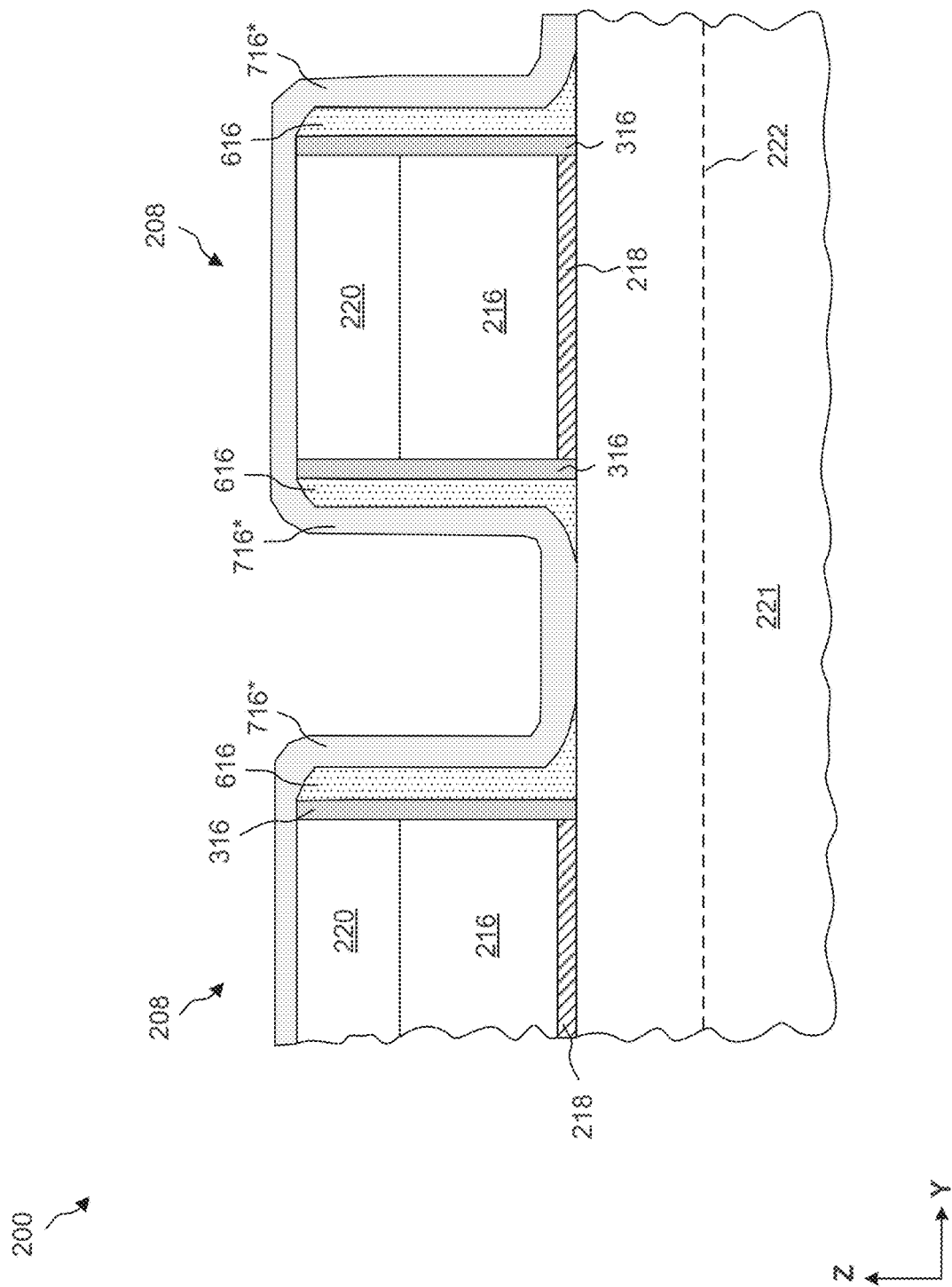

FIG. 7 illustrates third spacer material formed on semiconductor structure 200, according to some embodiments. Third spacer material 716* is deposited on exposed surfaces of semiconductor structure 200, such as on top surfaces of hard mask 220, second spacer 616, and fin region 221. In some embodiments, the deposition process for third spacer material 716* can be an ALD process in some embodiments, the deposition process can be CVD, PVD, PECVD, sputtering, evaporation, any suitable deposition processes, and/or combinations thereof. In some embodiments, third spacer material 716* can be formed using silicon nitride. In some embodiments, third spacer material 716* can be formed using any suitable material, such as silicon oxide. In some embodiments, third spacer material 716* can be formed using a low-k dielectric material.

Figure 8:
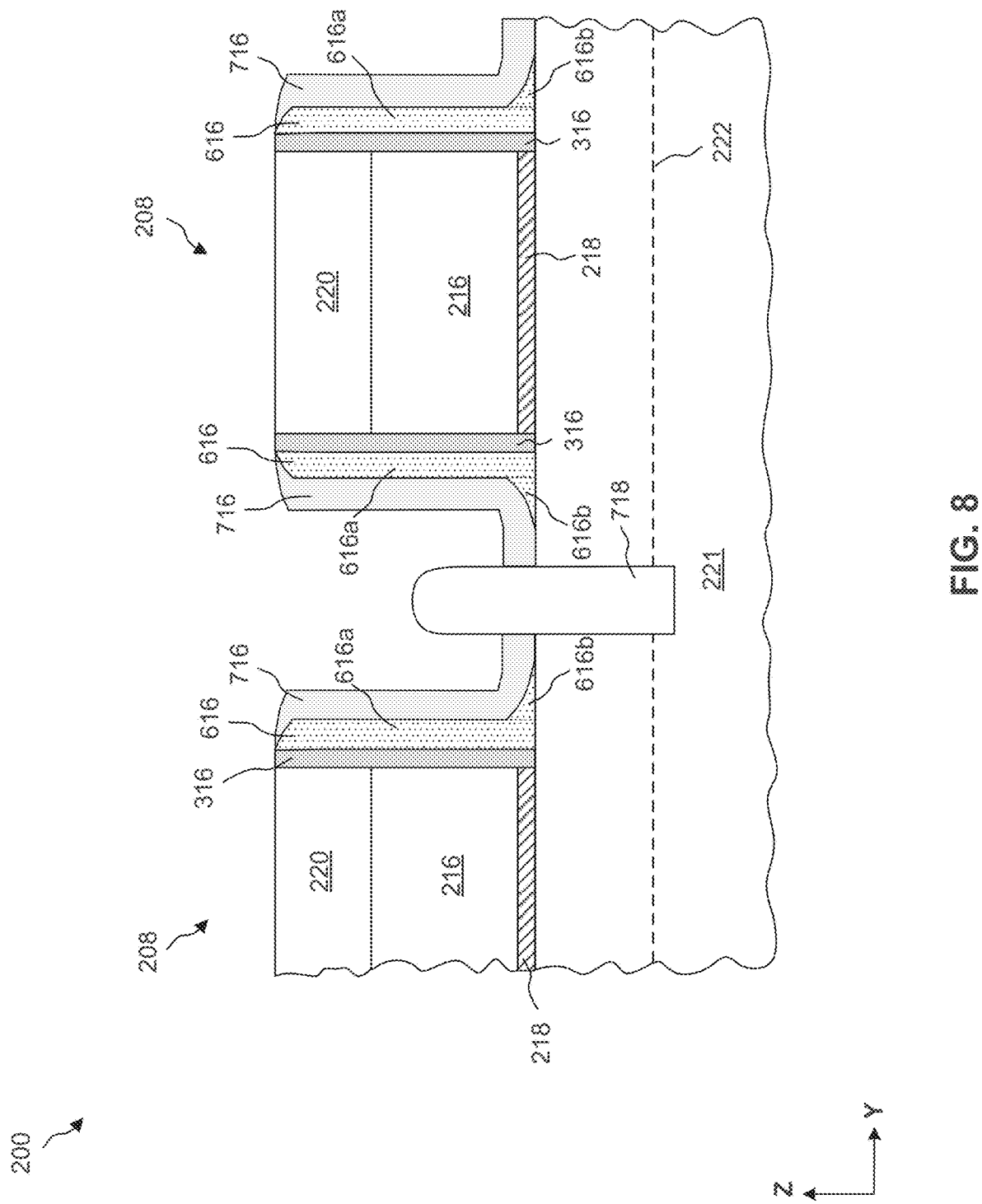

FIG. 8 illustrates third spacers formed on semiconductor structure 200 and source/drain regions formed in the fin regions and between adjacent third spacers, according to some embodiments. A portion of top surface 604 of fin regions 221 is exposed after opposing second spacers 616 are formed. Third spacers 716 can be formed to substantially cover second spacers 616 and also on exposed surfaces of fin regions 221. For example, third spacers 716 are in physical contact with portions of the top surfaces of fin regions 221. Third spacers 716 can be formed by removing third spacer material 716* from over the gate structures 208 and exposing portions of fin region 221. For example, an etching process is performed subsequently to remove portions of third spacer material 716* such that remaining third spacer material 716* covers exposed surfaces of second spacers 616 but exposes portions of surfaces of fin regions 221. An exemplary etching process includes forming a photoresist layer overlying third spacer material 716*, exposing the photoresist to a pattern, performing a post-exposure bake process and developing the resist to form a masking element including the resist. The area of third spacer material 716* that is not protected by the masking element is etched using, for example, a reactive ion etching (RIE) process and/or any other suitable process. The photoresist layer is subsequently removed by any suitable resist strip process. Second spacers 616 are protected by third spacers 716 during various fabrication processes that forms recess in fin region 221. For example, various fabrication processes can include cleaning processes, wet chemical etching processes, dry etching processes, ion implantation processes, and any other suitable fabrication processes. Lower portions 616b of second spacers 616 are embedded between third spacers 716 and top surfaces of fin region 221. Therefore, wet chemical etchants from a wet chemical etching process or ions from a dry plasma etching process would not come to contact with second spacer 616 during the etching processes. For example, gate dielectric layer 218 can be protected by first and second spacers 316 and 616 during the etching process used to form recesses in fin region 221. In some embodiments, gate dielectric layer 218 can be protected by first and second spacers 316 and 616 during oxide removal process from the source/drain regions. In some embodiments, third spacers 716 can be sacrificial sidewall spacers that are referred to as "dummy sidewall structures" that can provide protection to gate structures 208 during fabrication processes and can be subsequently removed if needed.

Source/drain regions can be formed in fin region 221 after third spacers 716 are formed. A recess is formed in fin regions 221 by removing portions of fin regions 221 not protected by third spacers 716. Specifically, during the formation of the recess, third spacers 716 are used as a hard mask such that portions of fin region 221 is protected from the etching process. The horizontal (e.g., in the y-direction) boundary of the recess is self-aligned to the adjacent third spacers 716 in some embodiments, the recesses may be formed to have either an angular or rounded shape at their bottoms. After the recess is formed, an epitaxial material is grown in the recess to form source/drain regions 718. In some embodiments, one or more ion implantation processes can be performed on source/drain regions 718 such that source/drain regions 718 can be doped with either p-type or n-type dopants, based on the device design. FIG. 8 shows that epitaxial material is grown in the recess to form source/drain regions 718. In some embodiments, the epitaxial material filling the recesses is a silicon-containing material. For example, source/drain region 718 can be formed of silicon germanium (SiGe). In some embodiments, source/drain region 718 can be formed by CVD, low pressure CVD (LPCVD), ultrahigh vacuum CVD (UHVCVD), PECVD, remote plasma CVD (RPCVD), molecular beam epitaxy (MBE) processes, any suitable epitaxial process, and/or combinations thereof.

Figure 9:
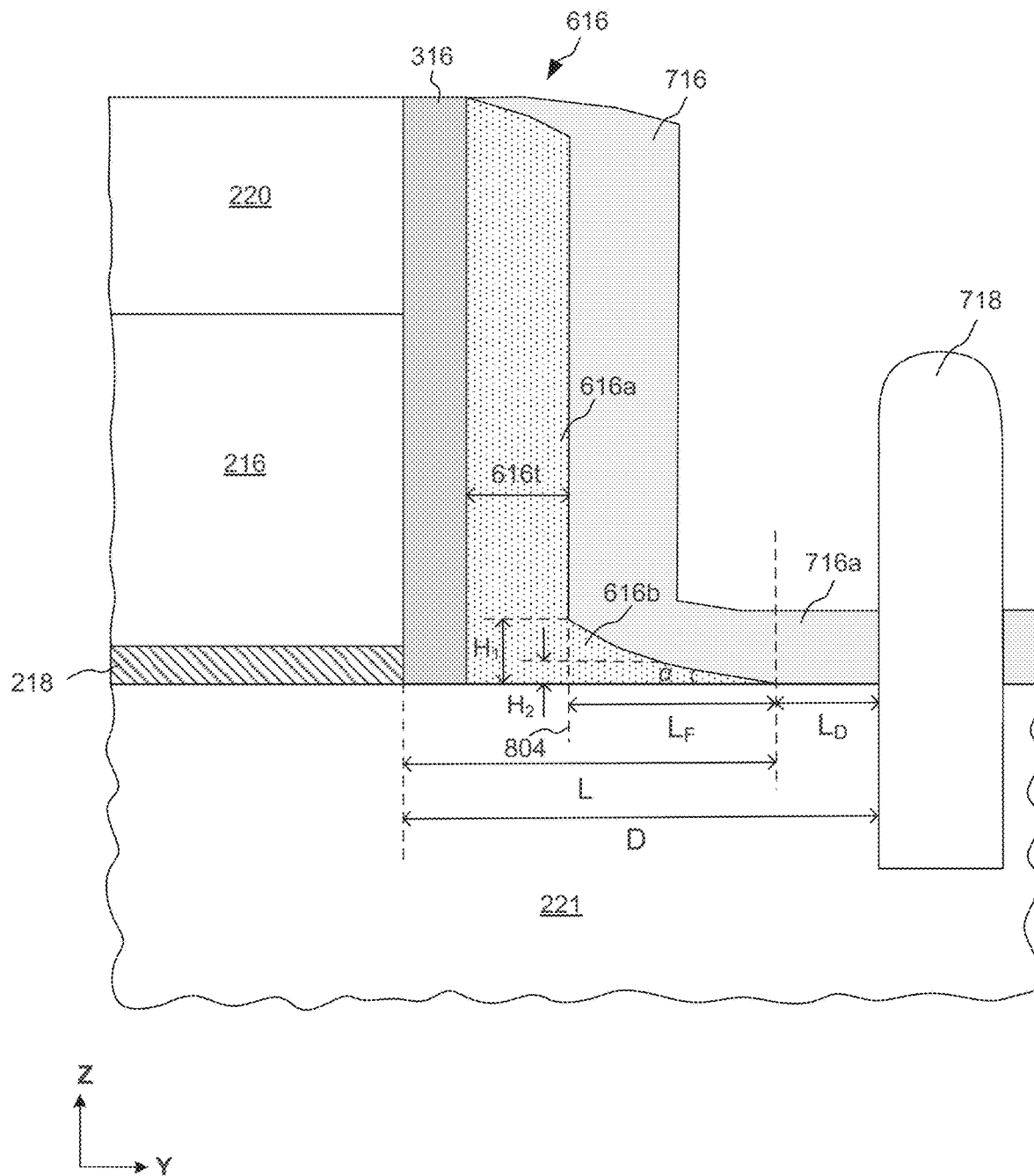

FIG. 9 is a zoomed-in view of the multi-spacer structure and the source/drain regions formed on semiconductor structure 200, according to some embodiments. Upper portion 616a of second spacer 616 extends in the vertical direction (e.g., z-direction) and formed on first spacer 316. The upper portion 616a of second spacer 616 can have a substantially conformal thickness along first spacer 316. Upper portion 616a has a thickness 616t between about 1 nm and about 4 nm. In some embodiments, thickness 616t can be between about 1 nm and about 2 nm or between about 2 nm and about 4 nm. In some embodiments, thickness 616t can be about 2 nm, about 3 nm, or about 4 nm.

Lower portion 616b extends in a horizontal direction (e.g., y-direction) and formed on fin region 221. The horizontal length $L_F$ of lower portion 616b can be in a range between about 2 nm and about 12 nm. In some embodiments, length $L_F$ can be between about 2 nm and about 4 nm, between about 4 nm and about 8 nm, or between about 8 nm and about 12 nm. In addition, the wedge-shaped lower portion 616b can have a thick end abutting upper portion 616a and tapers into a thin end. For example, lower portion 616b can have a gradually-reducing vertical thickness as it extends away from gate structure 208 along the horizontal direction (e.g., y-direction). Height $H_1$ of lower portion 616b measured at its thickest end (e.g., measured at dashed line 804) can be between about 1 nm and about 4 nm. Height $H_2$ of lower portion 616b measured at mid-point of length $L_F$ (half the length of $L_F$) can be between about 0.5 nm and about 3 nm. In some embodiments, the maximum value of thickness 616t and height $H_1$ are substantially equal to each other such that lower portion 616b can achieve maximum initial thickness which in turn provides better protection of gate dielectric layer 218. In some embodiments, a ratio between thickness 616t and length $L_F$ can be between about 0.5 and about 2, where a greater value of the ratio can be a result of greater separation between lower portion 616b and source/drain region 718. In some embodiments, a horizontal distance D between source/drain region 718 and gate structure 208 can be determined based on technology nodes. For example, distance D can be between about 9 nm and about 15 nm. In some embodiments, distance D can be between about 9 nm and about 12 nm or between about 12 nm and about 15 nm. In some embodiments, distance D can be about 10 nm. An angle α between top surface of 616b and top surface of fin region 221 can be between about 50 and about 85°. In some embodiments, the angle α can be between about 5° and about 30°, between about 30° and about 45', between about 45° and about 60', between about 60° and about 85°, or at other suitable angles. In some embodiments, a greater angle α indicates a greater length $L_F$ over height $H_1$ ratio. In some embodiments a portion 716a of third spacer 716 is formed on (e.g., in contact with) fin region 221 and positioned between the thinner edge of lower portion 616b and source/drain region 718. In other words, portion 716a of third spacer 716 abuts source/drain region 718 and lower portion 616b of second spacer 616. While forming source/drain region 718 in fin region 221, no portions of second spacer 616 is exposed to etching or cleaning wet chemicals used in the fabrication process, as portion 716a protects lower portion 616b of second spacer 616. If third spacer 716 is over-etched and portion 716a of third spacer 716 is removed during the formation of source/drain region 718, lower portion 616b of second spacer 616 can still provide additional protection by preventing wet chemicals from reaching first spacer 316 or gate dielectric layer 218. In some embodiments, the horizontal length $L_D$ of portion 716a that is formed between source/drain region 718 and lower portion 616b can be equal to or greater than about 0.5 nm. A greater $L_D$ can provide additional protection of underlying spacer materials and gate dielectric layer 218 as chemical etchants used in any subsequent etching processes would need to remove a greater amount of material contained in portion 716a to access any underlying material. Additionally, horizontal distance L between gate structure 208 and thin end of lower portion 616b can be between about 5 nm and about 8 nm. In some embodiments, a ratio between $L_D$ and L can be in a range between about 1:8 and about 1:3 where a greater ratio results in lower portion 616b having a shorter lateral dimension. In some embodiments, a difference between distance D and length L (e.g., a length $L_D$) or a distance between lower portion 616b and source/drain region 718 can be greater than about 0.5 nm. For example, length $L_D$ can be between about 0.5 nm and about 1.5 nm or between about 1.5 nm and about 2.5 nm. In some embodiments, length $L_D$ can be about 1 nm. In some embodiments, length $L_D$ can be greater than 2.5 nm.

In some embodiments, third spacer 716 can be removed after the formation of source/drain region 718 using suitable removal processes. Wet chemical etching processes, such as those using phosphoric acid ($H_3PO_4$), can remove third spacer 716 and expose underlying second spacers 616. In some embodiments, dry chemical etching processes can be used. For example, the dry chemical etching process can use an etching gas including at least one of hydrogen chloride (HCl), chlorine ($Cl_2$), other suitable etching gases, and/or combinations thereof. Lower portion 616b can provide additional protection of gate dielectric layer 218 during the third spacer removal process and protect underlying gate dielectric layer 218 from being eroded by the etching process. Additional layers and structures can be formed after the formation of third spacer 716. For example, an interlayer dielectric layer (ILD), contacts, interconnect layers, and other suitable structures can be formed.

Figure 10:
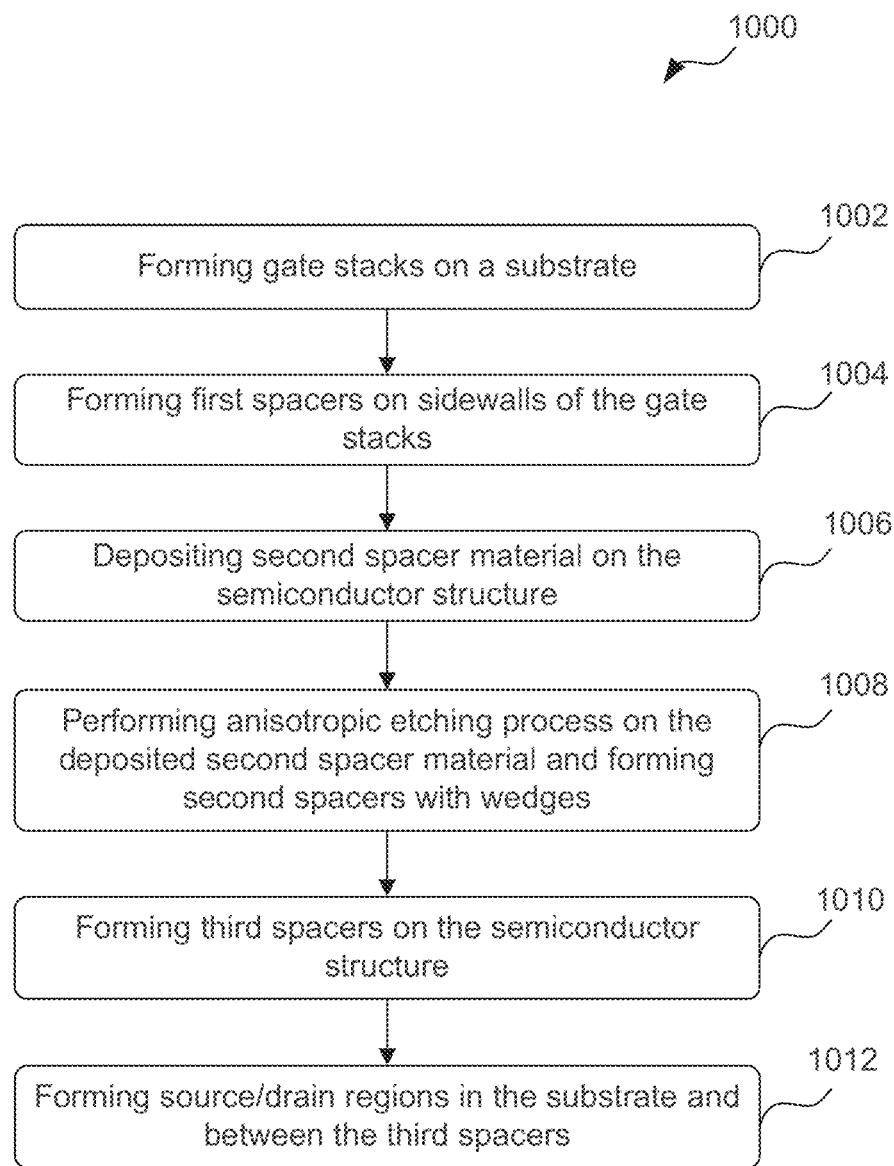
FIG. 10 is a flow diagram of an exemplary method of forming multi-spacer structures in semiconductor structures, in accordance with some embodiments.

FIG. 10 is a flow diagram of an exemplary method 1000 of forming multi-spacer structure in semiconductor structures, in accordance with some embodiments of the present disclosure. Based on the disclosure herein, other operations in method 1000 can be performed. Further, the operations of method 1000 can be performed in a different order and/or vary.

At operation 1002, gate stacks are formed on a substrate, in accordance with some embodiments. In some embodiments, forming the gate stacks can include forming a gate dielectric layer formed on a substrate, forming a gate electrode on the gate dielectric layer, and forming a hard mask on the gate electrode. In some embodiments, the substrate can include fin regions protruding from surrounding STI regions that are formed on the substrate, and the gate stacks are formed on the fin regions. In some embodiments, the gate dielectric layer can be a high-k dielectric layer (e.g., dielectric layers having dielectric constant greater than 3.9). For example, gate dielectric layer can be formed of $HfO_2$. In some embodiments, the gate dielectric layer can be formed using an ALD process. Examples of the gate dielectric layer, gate electrode, and hard mask can be gate dielectric layer 218, gate electrode 216, and hard mask 220, respectively, and are not further described here in detail for simplicity.

At operation 1004, first spacers are formed on sidewalls of the gate stacks, in accordance with some embodiments. In some embodiments, the first spacers can be made of a dielectric material, such as silicon nitride. In some embodiments, the first spacers can be formed using silicon oxide, spin-on-glass, silicon oxynitride, silicon oxycarbide, silicon carbide, FSG, organosilicate, low-k dielectric material, and/or other suitable insulating material. The dielectric value of the first spacers can be in a range from about 1 to about 3.9. For example, dielectric constant can be about 3.9. The deposition of the first spacers can be performed by any suitable process, such as ALD, CVD, PVD, ALD, MBE, HDPCVD, MOCVD, RPCVD, PECVD, other suitable methods, or combinations thereof. In some embodiments, first spacers (e.g., seal spacers) cover the sides of the gate structures. In some embodiments, thickness of the first spacers can be between about 3 nm and about 9 nm. For example, thickness of the first spacers can be between about 3 nm and about 5 nm, between about 5 nm and about 7 nm, between about 7 nm and about 9 nm. In some embodiments, the thickness of the first spacers can be about 4 nm Examples of first spacers can be first spacers 316 described above in FIG. 3.

At operation 1006, second spacer material is formed, in accordance with some embodiments. A dielectric material for forming the second spacer is blanket deposited on exposed surfaces of the semiconductor structure. In some embodiments, the second spacer material is silicon oxide. In some embodiments, the second spacer material is different from the material that forms the first spacers. Second spacer material can be deposited using ALD process and have a substantially conformal thickness. Examples of second spacer material can be second spacer material 416 described above in FIG. 4.

At operation 1008, an anisotropic etching process is performed on the deposited second spacer material to form second spacers with wedges at a lower portion, in accordance to some embodiments. The etching process can be a single etching process or multiple etching processes to remove portions of the deposited second spacer material. In some embodiments, the etching process can be an anisotropic (e.g., directional) etching process that has a greater etching rate in a vertical direction (e.g., z-direction) than the etching rate in a horizontal direction (e.g., y-direction). Etching rate of the second spacer material can be lower at the corners where the first spacer adjoins the substrate, and higher at regions near a central region of the surface that is mid-way between the adjacent first spacers. The variation in etching rates between the second spacer material that covers the corners and second spacer material that covers the central regions can form second spacers each having a substantially conformal upper portion that contours the first spacer and a wedge-shaped lower portion extending along a top surface of the substrate. In some embodiments, the etching process can be a biased etching process performed under a pressure of 3 mTorr to about 25 mTorr. For example, the pressure can be between about 3 mTorr and about 15 mTorr. In some embodiments, the pressure can be between about 15 mTorr and about 25 mTorr. The chemical etchant flow rate of the etching process can be about 5 sccm to about 40 sccm. For example, the chemical etchant flow rate can be between about 5 sccm and about 20 sccm. In some embodiments, the chemical etchant flow rate can be between about 20 sccm and about 40 sccm. In some embodiments, the etching process can be performed under a power of about 50 W to about 200 W. For example, the power can be between about 50 W and about 100 W, between about 100 W and about 200 W, and other suitable powers. The etching process can be performed at a bias voltage of about 30 V to about 200V. For example, the bias voltage can be between about 30 V and about 120 V, between about 120 V and about 200 V, or at other suitable bias voltages. The etching process can also be performed at a temperature of about 25° C. to about 200° C. For example, the temperature can be between about 25° C. and about 100° C., between about 100° C. and about 150° C., between about 150° C. and about 200° C., or at other suitable temperatures. In some embodiments, chemical etchant gas, such as $CF_4$, $SF_4$, and/or $NF_3$, can be mixed with $H_2$. In some embodiments, the mixing ratio of the chemical etchant gas over hydrogen can be between about 0 and about 0.5. For example, the mixing ratio can be between about 0 and about 0.2, between about 0.2 and about 0.4, or between about 0.4 and about 0.5. In some embodiments, increasing the bias voltage can increase the etching rate in the vertical direction (e.g., z-direction) while reducing the bias voltage can increase the etching rate in the horizontal direction (e.g., y-direction).

The anisotropic etching process can be a timed etching process and performed until a nominal shape of second spacers is achieved. For example, the etching process can continue until a nominal horizontal length of the lower portion of the second spacer is achieved. In some embodiments, a single etching process is performed such that a thin end of the lower portion and a subsequently formed source/drain structure is separated at a nominal distance (e.g., greater than about 0.5 nm). Alternatively, multiple etching processes can be performed and inspections are performed between each etching process to determine if a nominal distance is achieved. The etching process continues until a nominal distance between the lower portion and the subsequently formed source/drain region is reached.

At operation 1010, third spacers are formed on the semiconductor structure, in accordance to some embodiments. Third spacers can be formed to substantially cover the second spacers and also on exposed surfaces of the fin regions. The third spacers can be formed by blanket depositing a third spacer material on all exposed surfaces of the semiconductor structure and followed by an etching process to remove portions of the deposited third spacer material. The second spacers can be protected by the third spacers during various fabrication processes. For example, various fabrication processes can include cleaning processes, wet chemical etching processes, dry etching processes, ion implantation processes, and any suitable fabrication processes Examples of the third spacers can be third spacers 716 illustrated in FIG. 8.

At operation 1012, source/drain regions are formed in the substrate and between the third spacers. Source/drain regions can be formed in the substrate after the third spacers are formed. In some embodiments, source/drain regions can be formed in the fin regions on the substrate. A recess is formed in the fin regions by removing portions of the fin regions not protected by adjacent third spacers. After the recess is formed, an epitaxial material is grown in the recess to form the source/drain regions. In some embodiments, the source/drain regions can be formed using SiGe. In some embodiments, one or more ion implantation processes can be used to implant p-type or n-type dopants in the source/drain regions based on device design. The epitaxial source/drain regions can protrude from a top surface of the fin region. The source/drain region can be formed by CVD, LPCVD, UHVCVD, PECVD, RPCVD, MBE processes, any suitable epitaxial process, and/or combinations thereof. Examples of source/drain regions can be source/drain regions 718 described in FIG. 8.

Figure 11:
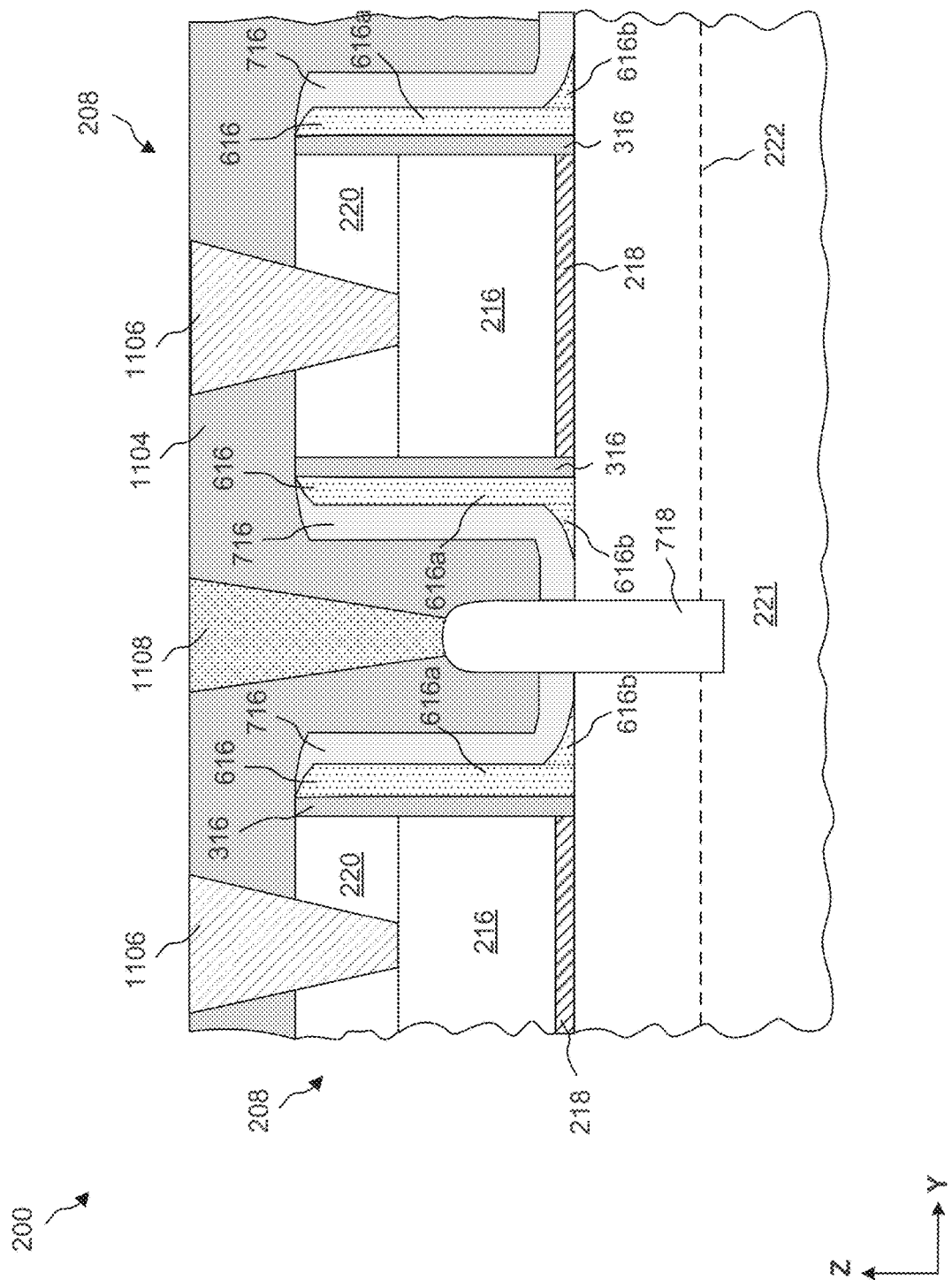
FIG. 11 is a cross-sectional view of a semiconductor structures, in accordance with some embodiments.

Other suitable structures can be formed after spacers and source/drain structures are formed in the semiconductor structure. FIG. 11 illustrates interlayer dielectric layer (ILD) and contact structures formed on semiconductor structure 200, according to some embodiments. ILD layer 1104 can be formed on exposed surfaces of hard mask 220, first, second, and third spacers 316, 616, and 716, source/drain regions 718, and any other exposed surfaces. ILD layer 1104 can be formed of a low-k dielectric material (e.g., dielectric layer having dielectric constant lower than about 3.9). For example, ILD layer 1104 can be formed using silicon oxide. In some embodiments, ILD layer 1104 can be formed using CVD, ALD, PVD, flowable CVD (FCVD), sputtering, any suitable deposition process, and/or combinations thereof. Contacts can be formed in ILD 1104 to establish electrical contacts between source/drain regions 718, gate electrode 216, and external circuitry such as peripheral circuits formed above semiconductor structure 200. Gate contacts 1106 can be formed in ILD 1104 and extend through hard mask 220 to be in physical contact with gate electrode 220. Similarly, source/drain contacts 1108 can extend through ILD 1104 and in physical contact with source/drain regions 718. Gate contacts 1106 and source/drain contacts 1108 can be formed by a patterning and etching process. For example, openings can be formed in ILD 1104 to expose gate electrode 216 and source/drain regions 718, respectively. A deposition process can be performed to deposit conductive material in the formed openings such that electrical connections can be made. Examples of the deposition process can be PVD, sputtering, electroplating, electroless plating, any suitable deposition process, and/or combinations thereof. A planarization process can be performed after the deposition process such that top surfaces of ILD 1104, gate contacts 1106, and source/drain contacts 1108 can be substantially coplanar (e.g., level). In some embodiments, gate contacts 1106 and source/drain contacts 1108 can be formed using tungsten, aluminum, cobalt, silver, any suitable conductive material, and/or combinations thereof.

Various embodiments in accordance with this disclosure provide a semiconductor device and method of fabricating the same to provide simple and cost-effective structures and process for reducing and/or eliminating damage to dielectric structures, such as gate dielectric layers. Specifically, a multi-spacer structure provides a protective seal to avoid wet etchant from consuming dielectric structures and penetrating into a gate dielectric, such as a high-k dielectric layer. The multi-spacer structure can thereby prevent gate dielectric layers from damage upon etching and/or cleaning processes, which in turn improves device yield and reduce device failure.

The multi-spacer structure includes a first spacer formed on the sidewall of the gate stack. The first spacer can be formed of silicon nitride and deposited to a thickness between about 5 nm and about 7 nm. In some embodiments, the first spacer thickness can be between about 3 nm and about 9 nm. For example, the thickness can be between about 3 nm and about 5 nm, between about 5 nm and about 7 nm, or between about 7 nm and about 9 nm. In some embodiments, the thickness can be about 4 nm. The first spacer can also be referred to as the seal spacer. In some embodiments, the first spacer has a conformal thickness along the sidewall of the gate stack. The first spacer can be deposited using any suitable deposition processes, such as, for example, atomic layer deposition (ALD) that can produce a thin film with conformal thicknesses. In some embodiments, the first spacer can be deposited using chemical vapor deposition (CVD), physical vapor deposition (PVD), and/or any suitable deposition processes.

The multi-spacer structure also includes a second spacer having an upper portion extending in the vertical direction and formed on the first spacer and a lower portion extending in a horizontal direction and formed on a top surface of the substrate. The upper portion of the second spacer can have a conformal thickness along the first spacer. The lower portion of the second spacer can be in the shape of a "foot" that has a gradually-reducing vertical thickness as the lower portion of the second spacer extends away from the gate stack. In some embodiments, the thickness of the lower portion of the second spacer can be in a range between about 0 nm and about 4 nm. For example, the thickness of the lower portion can be between about 2 nm and 4 nm. In some embodiments, the thickest portion of the lower portion can have a thickness of about 4 nm. In some embodiments, a horizontal distance L between the sidewall of the gate stack and the furthermost point of the lower portion away from the gate stack is less than a horizontal separation D between the gate stack and the epitaxial source/drain structure. In some embodiments, the horizontal distance L can be in a range between about 9 nm and about 15 nm. In some embodiments, the horizontal distance L can be about 12 nm. In some embodiments, the horizontal distance L can be between about 9 nm and about 12 nm. The horizontal distance L can vary depending on different technology node. In some embodiments, the difference between 1, and D can be equal to or greater than about 0.5 nm. For example, the difference can be about 1 nm. In some embodiments, the difference can be about 3 nm. In some embodiments, the second spacer can be formed by first depositing a layer of second spacer material on all exposed surfaces using a uniform deposition technique, such as an ALD process. In some embodiments, the second spacer material can be deposited using chemical vapor deposition (CVD), physical vapor deposition (PVD), and/or any suitable deposition processes. In some embodiments, the second spacer material can be silicon oxide deposited using an ALD process. One or more subsequent etching processes can be performed on the deposited second spacer material. For example, a substantially anisotropic dry etching process can be performed to substantially remove second spacer material that is deposited on horizontal surfaces. After the one or more etching processes are performed on the deposited second spacer material, the upper and lower portions of the second spacer are formed. In some embodiments, one anisotropic etching process is used to form the second spacer in some embodiments, two or more etching processes are used to form the second spacer. The etching processes can continue until the difference between horizontal distance L and horizontal separation D is equal to or greater than about 0.5 nm. For example, the horizontal separation D can be about 1 nm. In some embodiments, the horizontal separation D can be about 3 nm. In some embodiments, the etching processes can continue until the difference between L and D is between about 0.5 nm and about 3 nm. In some embodiments, the difference between L and D can be between about 0.5 nm and about 1 nm. The two or more etching processes can include isotropic and anisotropic etching processes. The second spacer, its lower portion in particular, can be used as an etch stop layer for subsequent etching and/or cleaning processes, such that the embedded gate dielectric layer is protected.

The multi-spacer structure can also include a third spacer formed on the second spacer. The third spacer can be formed on both the upper and lower portions of the second spacer. In some embodiments, the third spacer can be formed on the top surface of the substrate and between the lower portion of the second spacer and the source/drain region of the semiconductor device. In some embodiments, the third spacer can be formed using silicon nitride and deposited using ALD, CVD, PVD, any suitable deposition processes, and/or combinations thereof.

Other fabrication processes can also be performed on the semiconductor structure including the multi-spacer structures. For example, recesses can be formed in the substrate and in proximity to the third spacer for the epitaxial growth of source/drain structures. Other devices, films, interconnections can also be formed using suitable deposition and photolithography processes.

Embodiments of the present disclosure include a semiconductor device including a substrate having a top surface and a gate stack. The gate stack includes a gate dielectric layer on the substrate and a gate electrode on the gate dielectric layer. The semiconductor device also includes a multi-spacer structure. The multi-spacer includes a first spacer formed on a sidewall of the gate stack, a second spacer, and a third spacer. The second spacer includes a first portion formed on a sidewall of the first spacer and a second portion formed on the top surface of the substrate. The second portion of the second spacer has a thickness in a first direction that gradually decreases. The third spacer is formed on the second portion of the second spacer and in contact with the top surface of the substrate. The semiconductor device further includes a source/drain region formed in the substrate, and a portion of the third spacer abuts the source/drain region and the second portion of the second spacer.

Embodiments of the present disclosure also include a semiconductor device having a substrate. The semiconductor device includes a gate stack having a gate dielectric layer on the substrate and a gate electrode on the gate dielectric layer. The semiconductor device also includes a source/drain region in the substrate. The semiconductor device also includes a first spacer formed on a sidewall of the gate stack and a second spacer including: a first portion extending in a first direction and formed on a sidewall of the first spacer and a second portion extending in a second direction and formed on the substrate. The semiconductor device also includes a third spacer formed in contact with the substrate and between the second portion of the second spacer and the source/drain region.

Embodiments of the present disclosure further includes a method for forming a semiconductor device. The method includes forming a substrate and depositing a gate dielectric layer on the substrate. The method also includes forming a gate electrode on the gate dielectric layer and forming a first spacer on sidewalls of the gate dielectric layer and the gate electrode. The method further includes depositing a dielectric material on exposed surfaces of the first spacer, the gate electrode, and the substrate. The method further includes anisotropically etching the dielectric material to form a second spacer. The second spacer includes a first portion extending in a first direction and formed on a sidewall of the first spacer and a second portion extending in a second direction and formed on the substrate. The method also includes forming a third spacer on the second spacer and forming a source/drain region in the substrate. A portion of the third spacer is in contact with the substrate and between the second portion of the second spacer and the source/drain region.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method for forming a semiconductor device, comprising:
    forming a substrate;
    depositing a gate dielectric layer on the substrate;
    forming a gate electrode on the gate dielectric layer;
    forming a first spacer on sidewalls of the gate dielectric layer and the gate electrode;
    depositing a dielectric material on exposed surfaces of the first spacer, the gate electrode, and the substrate;
    anisotropically etching the dielectric material to form a second spacer, wherein the second spacer comprises:
        a first portion extending in a first direction and formed on a sidewall of the first spacer, wherein the first portion comprises a substantially-conformal thickness along the first spacer; and
        a second portion extending in a second direction and formed on the substrate,
    wherein the second portion comprises a thickness that decreases along a top surface of the substrate;
    forming a third spacer on the second spacer; and
    forming a source/drain region in the substrate, wherein a portion of the third spacer is in contact with the substrate and a sidewall of the source/drain region.

2. The method of claim 1, wherein forming the first spacer comprises depositing silicon nitride using atomic layer deposition (ALD).

3. The method of claim 1, wherein depositing the dielectric material comprises depositing silicon oxide using ALD.

4. The method of claim 1, wherein forming the third spacer comprises depositing silicon nitride using ALD.

5. The method of claim 1, wherein anisotropically etching the dielectric material comprises plasma etching the dielectric material in a horizontal direction at a first etching rate and in a vertical direction at a second etching rate, wherein the second etching rate is greater than the first etching rate.

6. A method, comprising:
    forming a gate stack on a top surface of a substrate;
    forming a first spacer on a sidewall of the gate stack and on the top surface of the substrate;
    depositing a dielectric material on the first spacer, the gate stack, and the top surface of the substrate;
    anisotropically etching the dielectric material to form a second spacer, wherein the second spacer comprises:
        a first portion extending in a vertical direction and formed on a sidewall of the first spacer, wherein the first portion comprises a substantially-conformal thickness along the first spacer; and
        a second portion extending in a horizontal direction and formed on the substrate,
    wherein a thickness of the second portion decreases along the horizontal direction;
    forming a source/drain region in the substrate; and
    forming a third spacer on the second spacer and in contact with the substrate and a sidewall of the source/drain region.

7. The method of claim 6, wherein the third spacer is in contact with the second spacer and the top surface of the substrate.

8. The method of claim 7, wherein forming the third spacer comprises depositing an other dielectric material on the top surface of the substrate and on the first and second spacers.

9. The method of claim 8, further comprising patterning the other dielectric material to expose a portion of the top surface of the substrate.

10. The method of claim 9, further comprising:
    etching the exposed portion of the top surface of the substrate to form an opening; and
    depositing an epitaxial material in the opening to form a source/drain region.

11. The method of claim 7, further comprising forming a source/drain region in the substrate, wherein a portion of the third spacer is in contact with the substrate and is formed between the second portion of the second spacer and the source/drain region.

12. The method of claim 6, wherein anisotropically etching the dielectric material comprises etching the dielectric material at a first etch rate in the vertical direction and a second etch rate in the horizontal direction, and wherein the first etch rate is greater than the second etch rate.

13. The method of claim 12, wherein the first etch rate at a top surface of the gate stack is greater than the first etch rate at the top surface of the substrate.

14. The method of claim 12, wherein the first etch rate at the top surface of the substrate varies with respect to a distance to the first spacer.

15. The method of claim 14, wherein the first etch rate at the top surface of the substrate increases as the distance to the first spacer increases.

16. A method, comprising:
    forming a gate stack on a top surface of a substrate;
    forming a first spacer on a sidewall of the gate stack;
    depositing a first portion of a dielectric material on the first spacer and a second portion of the dielectric material on the top surface of the substrate;
    forming a first portion of a second spacer, comprising:
        etching the first portion of the dielectric material in a horizontal direction at a first etching rate, wherein the first portion of the second spacer extends in a vertical direction and is formed on a sidewall of the first spacer, and wherein the first portion comprises a substantially-conformal thickness along the first spacer;
    forming a second portion of the second spacer, comprising:
        etching the second portion of the dielectric material in the vertical direction at a second etching rate, wherein the second etching rate varies with respect to a distance to the first spacer;
    forming a source/drain region in the substrate; and
    forming a third spacer on the second spacer and in contact with the substrate and a sidewall of the source/drain region.

17. The method of claim 16, wherein the second etching rate increases as the distance to the first spacer increases.

18. The method of claim 16, further comprising depositing an other dielectric material on the top surface of the substrate and on the second portion of the second spacer.

19. The method of claim 18, further comprising patterning the other dielectric material to expose a portion of the top surface of the substrate.

20. The method of claim 19, further comprising:
    etching the exposed portion of the top surface of the substrate to form an opening; and
    depositing an epitaxial material in the opening to form a source/drain region in contact with the other dielectric material.

* * * * *